(12) United States Patent
Jo et al.

(10) Patent No.: US 10,763,152 B2
(45) Date of Patent: Sep. 1, 2020

(54) SUBSTRATE SUPPORT UNIT, HEAT TREATMENT UNIT, AND SUBSTRATE TREATING APPARATUS INCLUDING THE SAME

(71) Applicant: SEMES CO., LTD., Cheonan-si, Chungcheongnam-do (KR)

(72) Inventors: Min Woo Jo, Seosan-si (KR); Cheolmin Choi, Cheongju-si (KR); Sanguk Park, Cheonan-si (KR); Man Kyu Kang, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 383 days.

(21) Appl. No.: 15/823,311

(22) Filed: Nov. 27, 2017

(65) Prior Publication Data

US 2018/0151409 A1 May 31, 2018

(30) Foreign Application Priority Data

Nov. 30, 2016 (KR) .......................... 10-2016-0161125

(51) Int. Cl.
*B25B 11/00* (2006.01)
*H01L 21/687* (2006.01)
*H01L 21/67* (2006.01)
*H01L 21/677* (2006.01)

(52) U.S. Cl.
CPC .... *H01L 21/68785* (2013.01); *H01L 21/6715* (2013.01); *H01L 21/67109* (2013.01); *H01L 21/67178* (2013.01); *H01L 21/67769* (2013.01); *H01L 21/6875* (2013.01); *H01L 21/68742* (2013.01)

(58) Field of Classification Search
CPC ............................. B25B 11/00; B25B 11/005
See application file for complete search history.

(56) References Cited

U.S. PATENT DOCUMENTS 5,213,349 A * 5/1993 Elliott ................. H01L 21/6831
269/8
2011/0024399 A1 * 2/2011 Kim .................. H01J 37/32009
219/121.41

(Continued)

FOREIGN PATENT DOCUMENTS

JP H09148417 A 6/1997
JP 2015-220385 12/2015

(Continued)

OTHER PUBLICATIONS

Examination Report for KR App No. 10-2016-0161125 dated Mar. 6, 2018, 10 pgs.

*Primary Examiner* — Lee D Wilson
(74) *Attorney, Agent, or Firm* — Procopio, Cory, Hargreaves & Savitch LLP

(57) ABSTRACT

Embodiments of the inventive concept relate to a substrate treating apparatus. A substrate support unit configured to support a substrate includes a support plate, on which the substrate is positioned, the support plate may include a passage formed on an upper surface of the support plate and connecting a central area and a side surface of the support plate, and a recess formed in a peripheral area of the support plate and recessed inwards from a side surface of the support plate, and the recess may communicate with one end of the passage.

19 Claims, 11 Drawing Sheets

(56) References Cited

U.S. PATENT DOCUMENTS

| | | | | |
|---|---|---|---|---|
| 2013/0189802 A1* | 7/2013 | Tromp | ................... | G03F 7/707 |
| | | | | 438/14 |
| 2015/0179416 A1* | 6/2015 | Zhou | ................... | H01J 37/3288 |
| | | | | 451/364 |
| 2016/0204019 A1* | 7/2016 | Ishii | ................. | H01L 21/68707 |
| | | | | 269/296 |
| 2018/0151409 A1* | 5/2018 | Jo | .................... | H01L 21/67109 |

FOREIGN PATENT DOCUMENTS

| | | |
|---|---|---|
| KR | 10-0711729 | 4/2007 |
| KR | 10-0784389 B1 | 12/2007 |
| KR | 20-2014-0001829 | 3/2014 |
| KR | 10-1449769 B1 | 10/2014 |
| KR | 10-2016-0081008 | 7/2016 |

\* cited by examiner

SUBSTRATE SUPPORT UNIT, HEAT TREATMENT UNIT, AND SUBSTRATE TREATING APPARATUS INCLUDING THE SAME

CROSS-REFERENCE TO RELATED APPLICATIONS

A claim for priority under 35 U.S.C. § 119 is made to Korean Patent Application No. 10-2016-0161125 filed on Nov. 30, 2016, in the Korean Intellectual Property Office, the entire contents of which are hereby incorporated by reference.

BACKGROUND

Embodiments of the inventive concept relate to a substrate treating apparatus.

In general, various processes such as cleaning, deposition, photographing, etching, and ion implantation are performed to manufacture a semiconductor device. A photolithographic process performed to form a pattern plays an important role in achieving high integration of a semiconductor device.

The photographing process is performed to form a pattern on a substrate. In the photographing process, a coating process, an exposure process, and a development process are sequentially performed, and the processes include a plurality of substrate treating operations. The substrate treating operations undergo a process of temporarily preserving a substrate to perform the next operation after one treatment operation is performed. Because a treated substrate generally maintains a high temperature state in a process of temporarily preserving the substrate, a process of cooling the substrate is performed. Accordingly, a substrate treating apparatus for performing a photographing process on a substrate generally includes a cooling unit for cooling the substrate in a process of temporarily preserving the substrate.

FIG. 1 is a perspective view illustrating a general cooling plate 30. Referring to FIG. 1, the cooling unit generally includes a cooling plate 30 which supports a substrate and in which a cooling passage 31, through which a cooling fluid flows, is formed in the interior thereof. The cooling plate 30 has a pin hole 32, through which a lift pin for lifting and lowering a substrate is elevated. A support boss 33 for preventing a substrate from directly contacting the cooling plate 30 may be provided on an upper surface of the cooling plate 30. However, there is a limit in increasing the height of the support boss 33 in consideration of the heat transfer and the spaces between the cooling plate 30 and the substrate. Accordingly, an upper surface of the cooling plate 30 and the substrate positioned on the cooling plate 30 are provided adjacent to each other. Therefore, when the lift pin lifts or lowers the substrate through the pin hole 32, the gases in a space between the upper surface of the cooling plate 30 and the substrate cannot smoothly flow. Accordingly, when the lift pin lifts the substrate through the pin hole 32, the substrate vibrates due to a pressure difference between the space and an exterior space. Further, when the lift pin lifts the substrate through the pin hole 32, it is not easy to stably position the substrate on the cooling plate 30 due to the pressure difference between the space and an exterior space.

PRIOR TECHNICAL DOCUMENTS

Patent Documents

Korean Patent No. 10-07843890000

SUMMARY

Embodiments of the inventive concept provide an apparatus for minimizing vibration when a substrate is lifted.

Embodiments of the inventive concept also provide an apparatus for stably positioning a substrate.

The technical objects of the inventive concept are not limited to the above-mentioned ones, and the other unmentioned technical objects will become apparent to those skilled in the art from the following description.

The inventive concept provides a substrate support unit configured to support a substrate. The substrate support unit may include a support plate, on which the substrate is positioned, the support plate may include a passage formed on an upper surface of the support plate and connecting a central area and a side surface of the support plate, and a recess formed in a peripheral area of the support plate and recessed inwards from a side surface of the support plate, and the recess may communicate with one end of the passage.

The passage may be recessed from the upper surface of the support plate downwards.

When viewed from the top, the width of the recess may be larger than the width of the passage, and the vertical length of the recess may be larger than the depth of the passage.

When viewed from the top, an inner end of the recess may overlap a peripheral area of the substrate positioned on the support plate.

The substrate support unit further may include a plurality of lift pins that lowers the substrate to the support plate and lifts the substrate from the support plate, the support plate may have pin holes, through which the lift pins are elevated, and the passage may connect the pin holes and the side surface of the support plate.

The passage may include a first passage provided in a central area of the support plate in a ring shape, and a second passage connecting the first passage and the recess, and when viewed from the top, the first passage may overlap the pin holes.

A side surface of the passage may be inclined inwards as it goes downwards.

The passage may have a trapezoidal shape, a lower edge of which is narrower than an upper edge of the trapezoidal shape when viewed in a direction perpendicular to the length direction of the passage, or a V shape when viewed in a direction perpendicular to the length direction of the passage.

The inventive concept provides a heating unit configured to heat a substrate. The heating unit may include a housing configured to provide a space in the interior thereof, a substrate support unit configured to support the substrate in the space and having a support plate, on which the substrate is positioned, and a temperature adjusting member configured to adjust the temperature of the substrate supported by the support plate, the support plate may include a passage formed on an upper surface of the support plate and connecting a central area and a side surface of the support plate, and a recess formed in a peripheral area of the support plate and recessed inwards from a side surface of the support plate, and the recess may communicate with one end of the passage.

The passage may be recessed from the upper surface of the support plate downwards.

When viewed from the top, the width of the recess may be larger than the width of the passage, and the vertical length of the recess may be larger than the depth of the passage.

When viewed from the top, an inner end of the recess may overlap a peripheral area of the substrate positioned on the support plate.

The substrate support unit may further include a plurality of lift pins that lowers the substrate to the support plate and lifts the substrate from the support plate, the support plate may have pin holes, through which the lift pins are elevated, and the passage may connect the pin holes and the side surface of the support plate.

The passage may include a first passage provided in a central area of the support plate in a ring shape, and a second passage connecting the first passage and the recess, and when viewed from the top, the first passage may overlap the pin holes.

A side surface of the passage may be inclined inwards as it goes downwards.

The passage may have a trapezoidal shape, a lower edge of which is narrower than an upper edge of the trapezoidal shape when viewed in a direction perpendicular to the length direction of the passage, or a V shape when viewed in a direction perpendicular to the length direction of the passage.

The temperature adjusting unit may include a cooling member provided in the support plate and configured to cool the substrate supported by the support plate.

The heating unit may further include a buffer plate located on the support plate.

The temperature adjusting unit may further include a heating member provided in the support plate and configured to heat the substrate supported by the support plate.

The inventive concept provides a substrate treating apparatus. The substrate treating apparatus may include a treatment module configured to perform a process of treating a substrate, and an index module including a cassette, in which a plurality of substrates are accommodated, and an index robot configured to carry the substrate between process modules, the process module may include a heating unit configured to heat the substrate, the heating unit may include a substrate support unit configured to support the substrate and having a support plate, on which the substrate is positioned, and a temperature adjusting member configured to adjust the temperature of the substrate supported by the support plate, the support plate may include a passage formed on an upper surface of the support plate and connecting a central area and a side surface, and a recess formed in a peripheral area of the support plate and recessed inwards from a side surface of the support plate, and the recess may communicate with one end of the passage.

The passage may be recessed from the upper surface of the support plate downwards.

When viewed from the top, the width of the recess may be larger than the width of the passage, and the vertical length of the recess may be larger than the depth of the passage.

When viewed from the top, an inner end of the recess may overlap a peripheral area of the substrate positioned on the support plate.

The substrate support unit may include a plurality of lift pins that lowers the substrate to the support plate and lifts the substrate from the support plate, the support plate may have pin holes, through which the lift pins are elevated, and the passage may connect the pin holes and the side surface of the support plate.

The passage may include a first passage provided in a central area of the support plate in a ring shape, and a second passage connecting the first passage and the recess, and when viewed from the top, the first passage may overlap the pin holes.

A side surface of the passage may be inclined inwards as it goes downwards.

The temperature adjusting unit may further include a cooling member provided in the support plate and configured to cool the substrate supported by the support plate.

The heating unit may include a buffer plate located on the cooling plate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for those skilled in the art more completely. Accordingly, the shapes of the components of the drawings are exaggerated to emphasize clearer description thereof.

The apparatus of the present embodiment is used to perform a photolithographic process on a substrate, such as a semiconductor wafer or a flat display panel. In particular, the apparatus of the present embodiment is used to perform a coating process and a development process on a substrate.

Hereinafter, it will be exemplified that a wafer is used as a substrate. Hereinafter, a case of using a substrate as a substrate may be described as an example.

Figure 1:
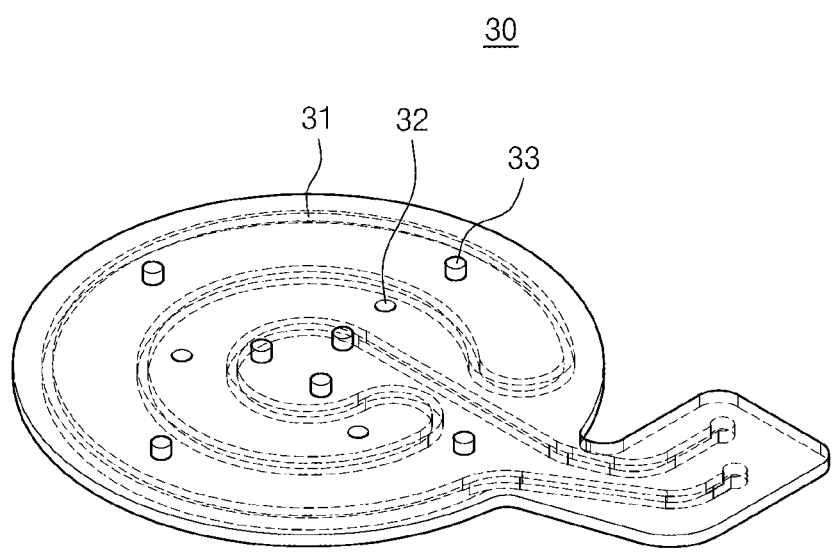
FIG. 1 is a perspective view illustrating a general cooling plate.
Figure 2:
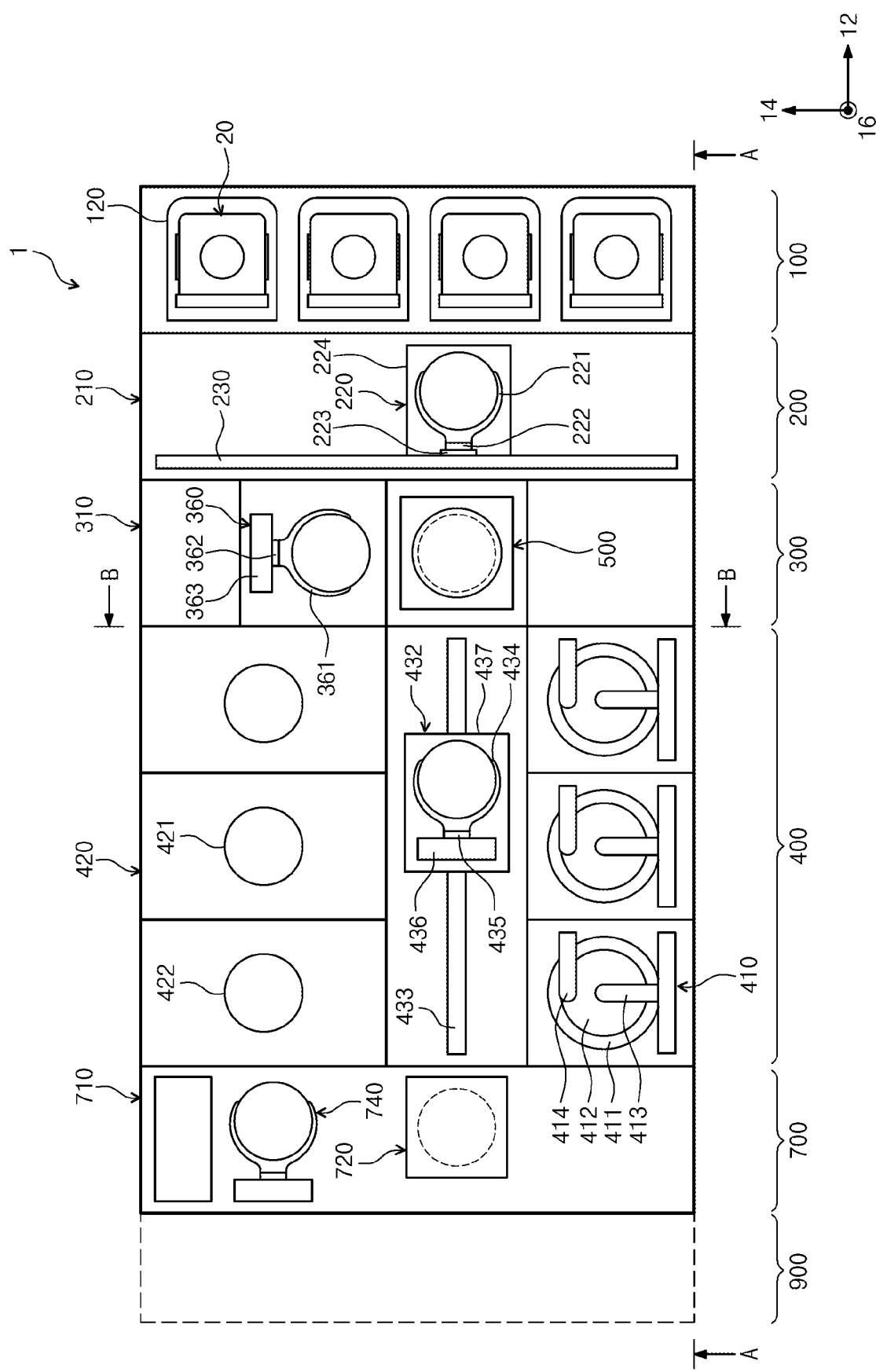
FIG. 2 is a plan view illustrating a substrate treating apparatus according to an embodiment of the inventive concept.
Figure 3:
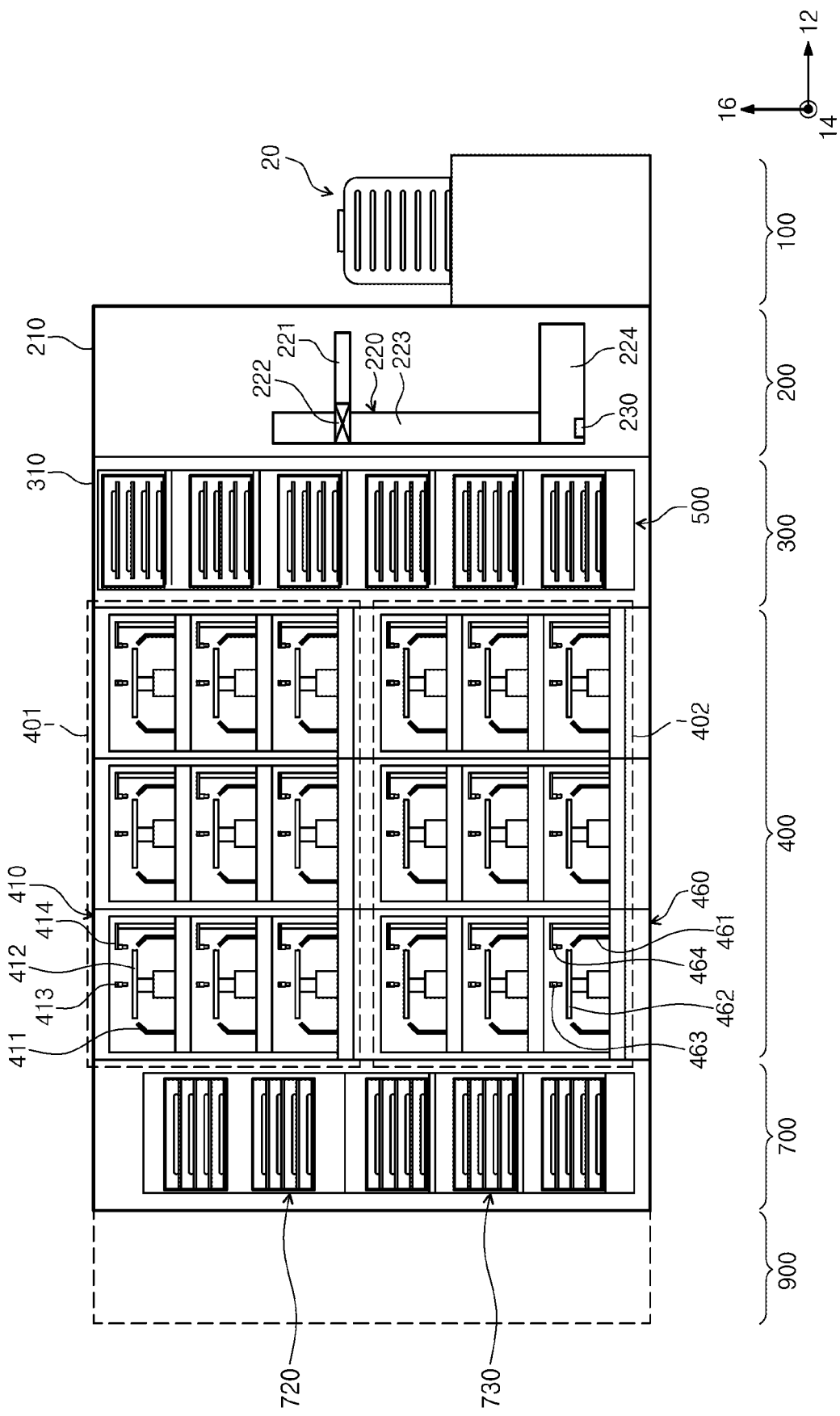
FIG. 3 is a view of the substrate treating apparatus of FIG. 2, taken along line A-A of FIG. 2.
Figure 4:
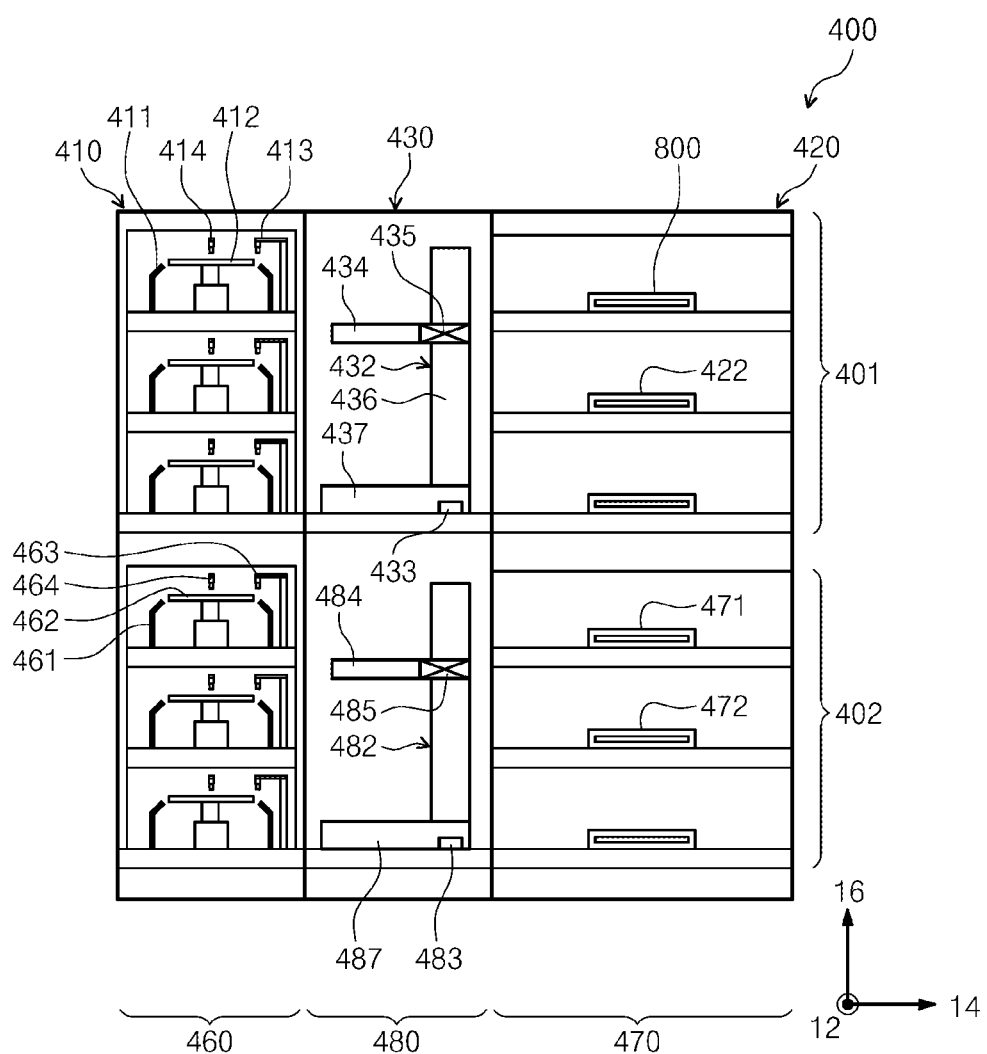
FIG. 4 is a view of the substrate treating apparatus of FIG. 2, taken along line B-B of FIG. 2.

FIGS. 2 to 4 are views schematically illustrating a substrate treating apparatus 1 according to an embodiment of the inventive concept. FIG. 2 is a view of the substrate treating apparatus 1, when viewed from the top. FIG. 3 is a view of the substrate treating apparatus 1 of FIG. 2, taken along line A-A of FIG. 2; FIG. 4 is a view of the substrate treating apparatus 1 of FIG. 2, taken along line B-B of FIG. 2;

Referring to FIGS. 2 to 4, the substrate treating apparatus 1 includes a load port 100, an index module 200, and a treatment module. The treatment module performs a process of treating a substrate. The treatment module includes a heating unit. The heating unit heats a substrate. According to an embodiment, the heating unit may correspond to a heating unit 800 and 472, a cooling unit 422 and 471, and a buffer unit 500.

According to an embodiment, the treatment module includes a buffer module 300, a coating/development module 400, and an interface module 700. The load port 100, the index module 200, the buffer module 300, the coating and development module 400, and the interface module 700 are sequentially disposed in a row in one direction.

Herein after a direction in which the load port 100, the index module 200, the buffer module 300, the coating and development module 400, and the interface module 700 are disposed is referred to as a first direction 12. A direction that is perpendicular to the first direction 12 when viewed from the top will be referred to as a second direction 14, and a direction that is perpendicular to the first direction 12 and the second direction 14 will be referred to as a third direction 16.

A wafer W is moved while being received in a cassette 20. A plurality of substrates may be accommodated in the cassette. The cassette 20 has a structure that is closed from the outside. For example, a front open unified pod (FOUP) that has a door on the front side may be used as the cassette 20.

Hereinafter, the load port 100, the index module 200, the buffer module 300, the coating and development module 400, and the interface module 700 will be described.

The load port 100 has a carrier 120 on which the cassette 20, in which the wafers W are received, is positioned. A plurality of carriers 120 are provided, and are disposed along the second direction 14 in a row. In FIG. 2, four carriers 120 are provided.

The index module 200 carries a substrate between the cassette 20 positioned on the carrier 120 of the load port 100 and the treatment module. According to an embodiment, the index module 200 feeds a wafer W between the cassette 20 positioned on the carrier 120 of the load port 100 and the buffer module 300. The index module 200 includes a frame 210, an index robot 220, and a guide rail 230. The frame 210 has a substantially rectangular parallelepiped shape having an empty interior, and is disposed between the load part 100 and the buffer module 300. The frame 210 of the index module 200 may have a height smaller than that of a frame 310 of the buffer module 300, which will be described below. The index robot 220 and the guide rail 230 are disposed in the frame 210. The index module 220 feeds a wafer W between the cassette 20 positioned on the carrier 120 of the load port 100 and the buffer module 300. The index robot 220 has a four-axis driven structure such that a hand 221 that directly handles a wafer W is movable and rotatable in the first direction 12, the second direction 14, and the third direction 16. The index robot 220 includes a hand 221, an arm 222, a support 223, and a prop 224. The hand 221 is fixedly installed in the arm 222. The arm 222 has a flexible and rotatable structure. The support 223 is configured such that the lengthwise direction thereof is disposed along the third direction 16. The arm 222 is coupled to the support 223 to be movable along the support 223. The support 223 is fixedly coupled to the prop 224. The guide rail 230 is provided such that the lengthwise direction thereof is disposed along the second direction 14. The prop 224 is coupled to the guide rail 230 to be linearly movable along the guide rail 230. Although not illustrated, the frame 210 is further provided with a door opener that opens and closes a door of the cassette 20.

The buffer module 300 includes a frame 310, a buffer unit 500, and a buffer robot 360.

The frame 310 has a rectangular parallelepiped shape having an empty interior, and is disposed between the index module 200 and the coating/development module 400.

Figure 5:
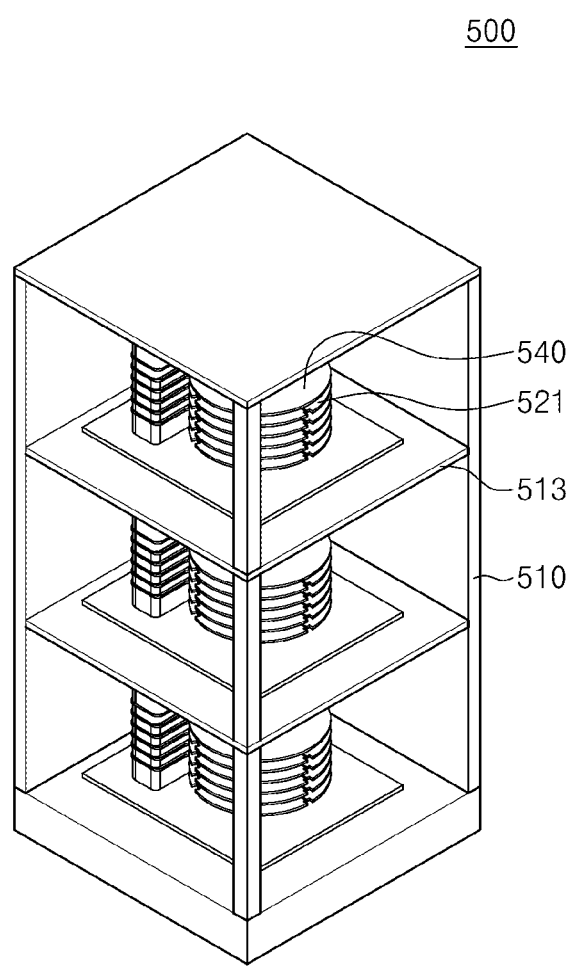
FIG. 5 is a perspective view illustrating a buffer unit of FIG. 2.

FIG. 5 is a perspective view illustrating a buffer unit 500 of FIG. 2; Referring to FIG. 5, the buffer unit 500 may temporarily preserve the substrate W before a process for the substrate W after a process. A plurality of buffer units 500 may be provided to correspond to the coating module and the development module. For example, two buffer units 500 may be provided. The buffer unit 500 includes a housing 510, a substrate support unit 520, a temperature adjusting member 530, a buffer plate 540, and a support shaft 550.

The housing 510 has a space in the interior thereof. The interior space of the housing 510 functions as a space, in which a substrate is temporarily preserved. The housing 510 has a substantially rectangular parallelepiped shape. The housing is located in the interior of the frame 310. The housing 510 is located adjacent to the index module 200. Opposite sides of the housing 510 are opened. As an example, the opened opposite sides of the housing 510 are located opposite to each other, and one of them faces the index module 200. The opened opposite sides of the housing 510 function as inlets, through which the substrate S is introduced and extracted.

A prop 513 is provided in the interior of the housing 510. The prop 513 may be a rectangular plate. A plurality of props 513 may be provided. The props 513 are located to be spaced apart from each other vertically. Accordingly, the interior space of the housing 510 is divided vertically. A plurality of plates 521 and 540 are located in the props 513. For example, three props 513 are provided. Selectively, two or less or four or more props 513 may be provided.

Figure 6:
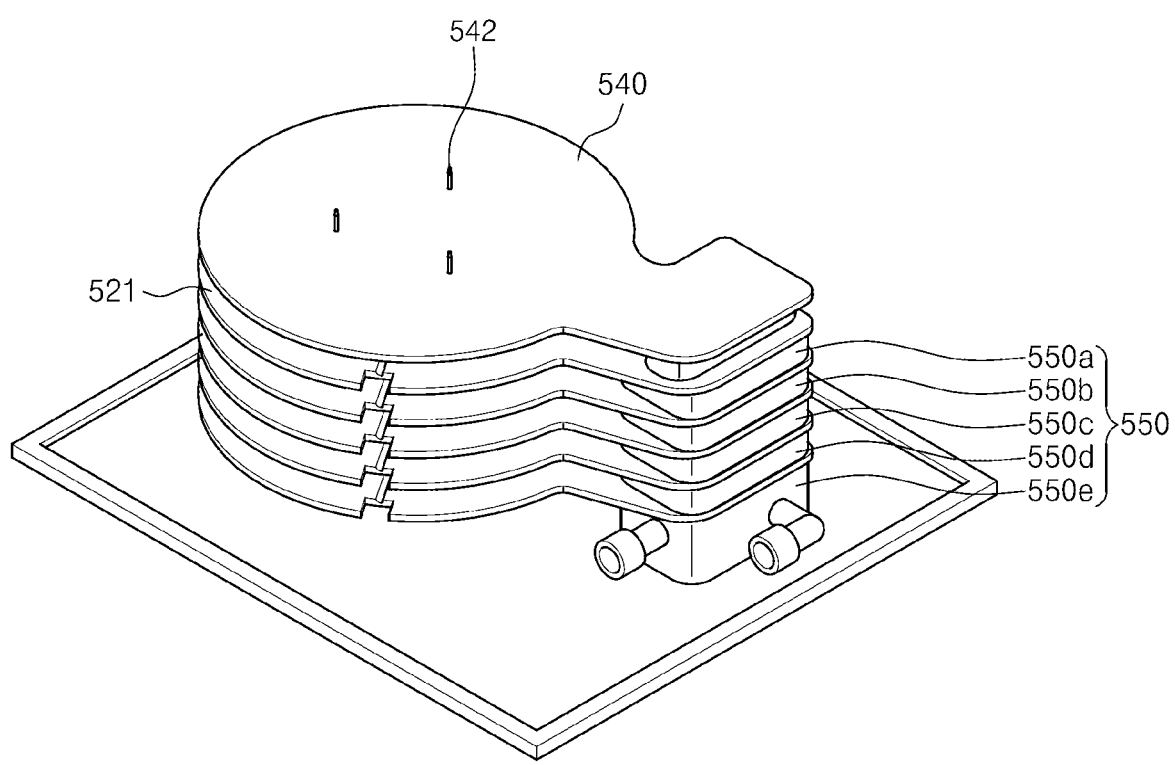
FIG. 6 is a perspective view illustrating a substrate support unit, a buffer plate, and a support shaft of FIG. 5.
Figure 7:
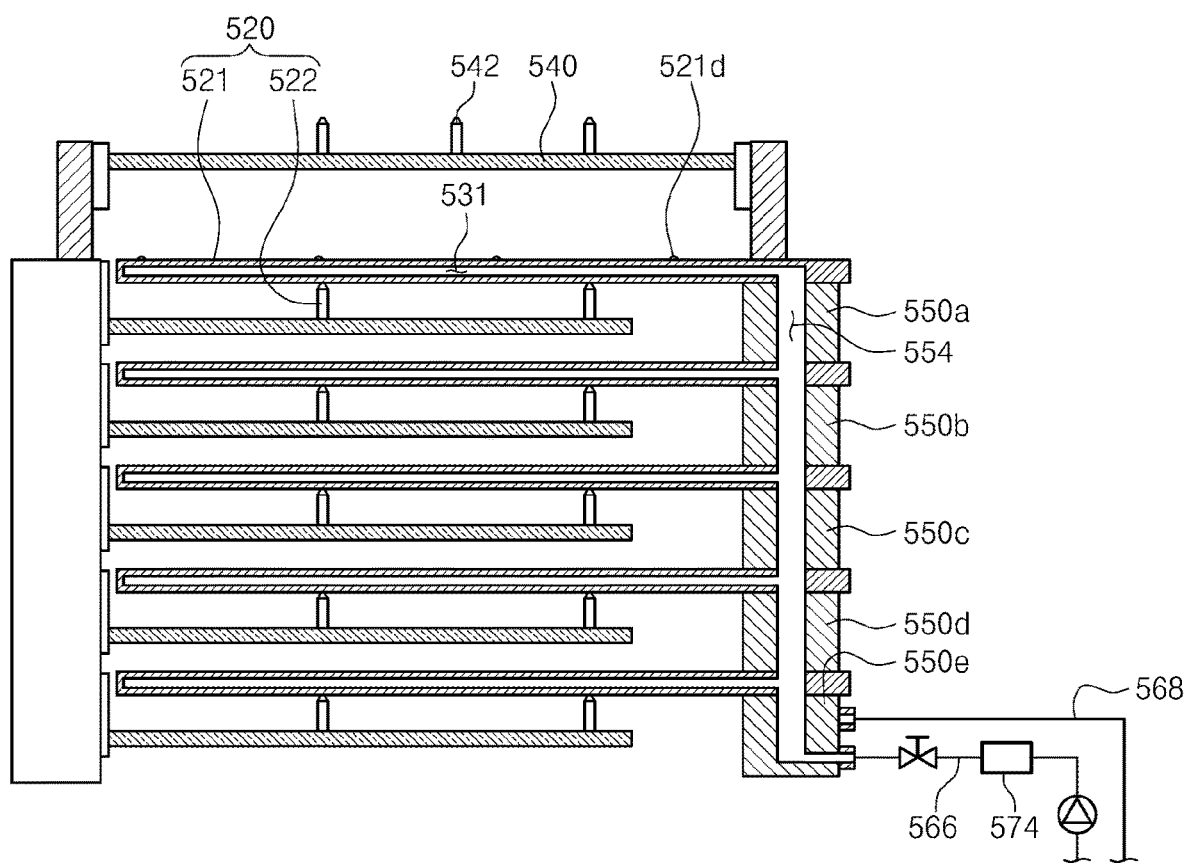
FIG. 7 is a sectional view illustrating the substrate support unit, the buffer plate, and the support shaft of FIG. 5.

FIG. 6 is a perspective view illustrating a substrate support unit 520, a buffer plate 540, and a support shaft 550 of FIG. 5. FIG. 7 is a sectional view illustrating the substrate support unit 520, the buffer plate 540, and the support shaft 550 of FIG. 5. Referring to FIGS. 6 and 7, the buffer plate 540 and the support plate 521 are located in the divided spaces of the housing 510. The buffer plate 540 and the support plate 521 are spaced apart from each other vertically. The buffer plate 540 and the support plate 521 are sequentially located along a direction which faces from the upper side toward the lower side. According to an example, a plurality of support plates 521, and the buffer plate 540 and the plurality of support plates 521 may be sequentially arranged. Selectively, a plurality of buffer plates 540 may be provided. The buffer plates 540 and the support plates 521 may have circular plate shapes.

The substrate support unit 520 supports the substrate in the space of the housing 510. The substrate support member 520 includes a support plate 521 and a lift pin 522.

A plurality of support plates 521 are located between the prop 513 and the buffer plate 540. The plurality of support plates 530 are located to be spaced apart from each other vertically. The plurality of support plates 530 are located to be stacked adjacent to each other. A substrate W is positioned on the upper surface of the support plate 521.

Figure 8:
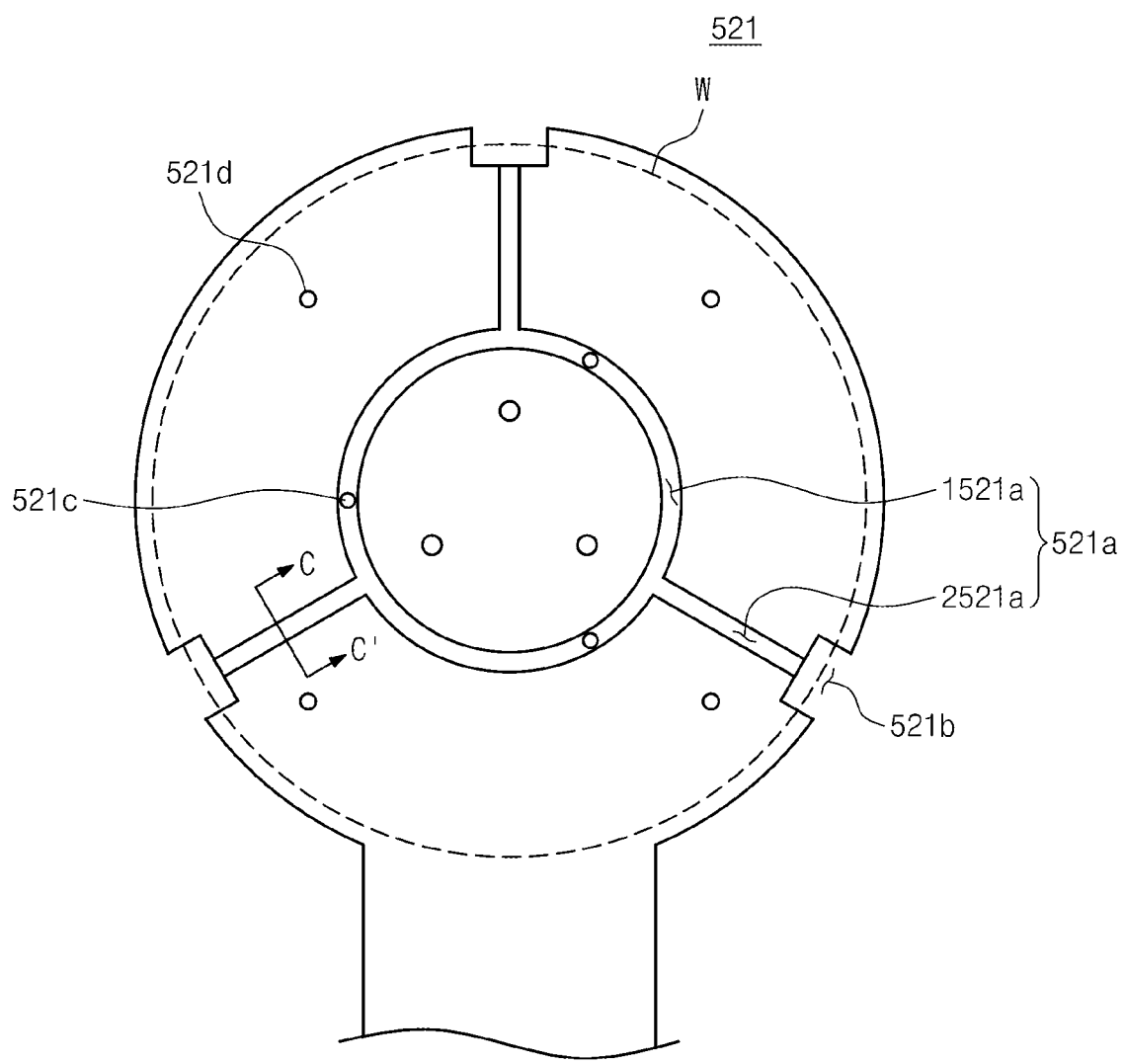
FIG. 8 is a view a support plate of FIG. 5, when viewed from the top.

FIG. 8 is a view a support plate 521 of FIG. 5, when viewed from the top. Referring to FIG. 8, according to an embodiment, a passage 521a connecting a central area of the support plate 521 and a side surface of the support plate 521 is formed on the upper surface of the support plate 521. The passage 521a is recessed from the upper surface of the support plate 521 downwards. A plurality of pin holes 521c, through which the lift pins 522 are elevated, are formed in the support plate 521. The passage 521a connects the pin hole 521c and a side surface of the support plate 521. For example, the passage 521a includes a first passage 1521a and a second passage 2521a. The first passage 1521a is provided in a central area of the support plate 521 in a ring shape. The second passage 2521a connects the first passage 1521a and the recess 521b. When viewed from the top, the first passage 1521a overlaps the pin hole 521c. The second passage 2521a may have a linear shape in which opposite ends of the second passage 2521a are connected to the first passage 1521a and the recess 521b, respectively. A plurality of second passages 2521a may be provided along a circumferential direction of the support plate 521 to be spaced apart from each other.

Figure 9:
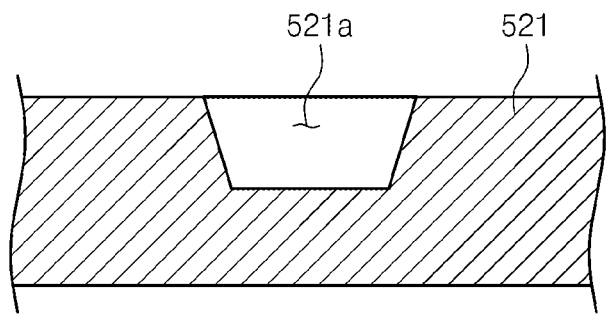
FIG. 9 is a cross sectional view of a passage cut along an C-C' line of FIG. 8.

FIG. 9 is a cross sectional view of a passage cut along an C-C' line of FIG. 8, Referring to FIG. 9, a side surface of the passage 521a is inclined inwards as it goes downwards. For example, the passage 521a may have a trapezoidal shape, a lower edge of which is narrower than an upper edge of the passage 521a when viewed in a direction perpendicular to the length direction of the passage 521a.

Figure 10:
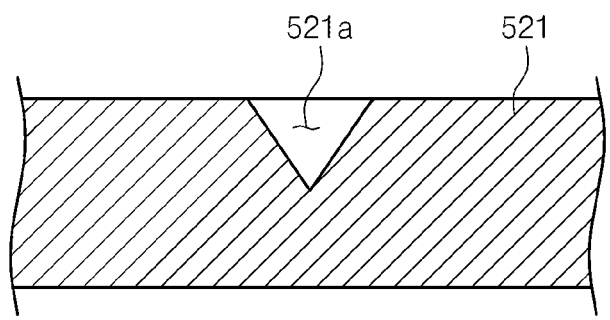
FIG. 10 is a cross sectional view of a passage cut along an C-C' of FIG. 8 according to another embodiment.

FIG. 10 is a cross sectional view of a passage cut along an C-C' of FIG. 8 according to another embodiment. Unlike the case of FIG. 9, a section of the passage 521a, viewed in a direction perpendicular to the length direction of the passage 521a, may have a V shape.

As described above, because the sides surface of the passage 521a is inclined inwards as it goes downwards, a distance between the side surface of the passage and the substrate may be shorter than in the case in which the side surface of the passage 521a is vertical and the area of the support plate 521 having a higher heat transfer rate that the gases provided in the space between the substrate and the support plate 521 may be widened. Accordingly, a heat transfer rate between the substrate and the support plate 521, which may be generated as the passage 521a is provided, may be prevented.

Figure 11:
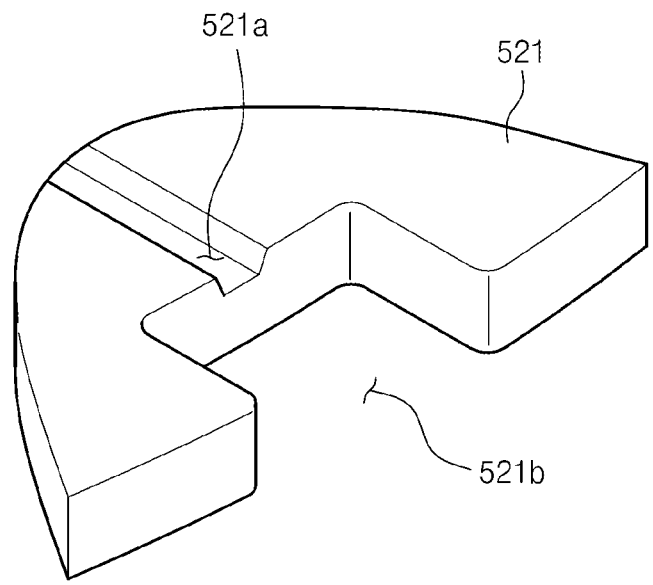
FIG. 11 is a perspective view illustrating a recess of FIG. 8.

FIG. 11 is a perspective view illustrating a recess 521b of FIG. 8. Referring to FIGS. 8 and 11, a recess 521b recessed inwards from the side surface of the support 521 is formed in a peripheral area of the support plate 521. The recess 521b is communicated with one end of the passage 521a. When viewed from the top, the width of the recess 521b may be larger than the width of the passage. The vertical length of the recess 521b is larger than the depth of the passage 521a. For example, the recess 521b may pass through the upper surface and the bottom surface of the support plate 521. When viewed from the top, an inner end of the recess 521b overlaps a peripheral area of the substrate W positioned on the support plate 521. Accordingly, as the area of the end of the passage 521a, through which gases are introduced and discharged to and from the outside becomes larger and the length of the passage 521a becomes shorter than in the case in which the recess 521b is not provided, the gases passing through the passage 521a may flow more easily.

A plurality of recesses 521b may be provided along the side surface of the support plate 521 to be spaced apart from each other. The number of the recesses 521b corresponds to the number of the second passages 2521a.

A support boss 521d may be provided on the upper surface of the support plate 521. The support boss 521d prevents the substrate positioned on the support plate 521 from directly contacting the upper surface of the support plate 521.

Referring to FIGS. 6 and 7 again, the lift pin 522 lowers the substrate to the support plate 521, and lifts the substrate from the support plate 521. A plurality of lift pins 522 are provided for one support plate 521. For example, three or more lift pins 522 are provided to stably support the substrate W. The lift pins 522 are provided in one-to-one correspondence to the pin holes 521c. The lift pins 522 corresponding to the support plates 521 may be elevated independently.

The temperature adjusting member 530 adjusts the temperature of the substrate supported by the support plate 521. According to an embodiment, the temperature adjusting member 530 may include a cooling member that cools the wafer W supported by the support plate 521. For example, the temperature adjusting member 530 is provided to a cooling passage 531, which is formed in the interior of the support plate 521 and through which the cooling fluid flows. The cooling passage 531 is a single passage. When viewed from the top, the cooling passage 531 may be provided to the support plate 521 to have a concentric shape. As an example, three circular cooling passages 531 may be provided. The circular cooling passages 531 are concentric and may be spaced apart from each other by a specific distance. For example, the cooling fluid may be cooling water.

The buffer plate 540 is located on the support plate 521. The buffer plate 540 supports the substrate W such that the substrate W carried between the index module 200 and the coating and development module 400 may be temporarily preserved. Accordingly, the index module 200 carries the substrate W accommodated in the cassette 20 to the buffer plate 540, and carries the substrate W positioned on the buffer plate 540 to the cassette 20. The buffer plate 540 has a circular plate shape. A plurality of support pins 542 are provided in the buffer plate 540. The support pin 542 protrudes upwards from the upper surface of the buffer plate 540. The substrate W may be positioned at an upper end of the support pin 522.

The support shaft 550 supports the buffer plate 540 and the support plate 521. The support shaft 550 includes a plurality of support blocks 550 (550a to 550e, hereinafter, 550). The support blocks 550 are stacked on one another. The support block 550 has a rectangular parallelepiped block. The support block 550 supports one support plate 521. The support plates 521 may be fixedly coupled to the upper surfaces of the support blocks 550. The buffer plate 540 may be supported by a separate support. A distribution passage 554 is provided in the support block 550. The supply passage 566 is communicated with the cooling passage 531. The distribution passage 554 is connected to a supply passage 566 and a recovery passage 568. Here, the supply passage 566 is a passage that is connected to the distribution passage 554 such that the cooling fluid may be supplied to the cooling passage 531. Here, the recovery passage 568 is a passage that is connected to the distribution passage 554 such that the cooling fluid provided to the cooling passage 531 may be recovered.

The cooling fluid is supplied to the cooling passage 531 through the supply passage 566 and is recovered to the recovery passage 568. A temperature adjustor 574 is installed in the supply passage 566. The temperature adjustor 574 cools the cooling fluid.

Referring to FIGS. 2 to 4 again, the buffer robot 360 feeds the substrate W between the plates 521 and 540 positioned in the housing 510, the heights of which are different. The buffer robot 360 has a hand 361, an arm 362, and a support 363. The hand 361 is fixedly installed in the arm 362. The arm 362 has a flexible structure, and allows the hand 361 to be moved along the second direction 14. The arm 362 is coupled to the support 363 to be linearly movable in the third direction 16 along the support 363. The support 363 has a length extending from a location corresponding to the second buffer 330 to a location corresponding to the first buffer 320. The support 363 may be provided to extend longer upwards or downwards. The buffer robot 360 may be provided such that the hand 361 is two-axis driven along the second direction 14 and the third direction 16.

The coating/development module 400 performs a process of coating a photoresist onto a wafer W before an exposure process and a process of developing the wafer W after the exposure process. The coating/development module 400 has a substantially rectangular parallelepiped shape. The coating/development module 400 has a coating module 401 and a development module 402. The coating module 401 and the development module 402 may be disposed to be partitioned from each other in different layers. According to an example, the coating module 401 is situated on the development module 402.

The coating module 401 performs a process of coating a photosensitive liquid such as a photoresist onto a wafer W and a heat treating process of, for example, heating and cooling the wafer W before and after the resist coating process. The coating module 401 has a resist coating chamber 410, a bake chamber 420, and a carrying chamber 430. The resist coating chamber 410, the bake chamber 420, and the carrying chamber 430 are sequentially disposed along the second direction 14. A plurality of resist coating chambers 410 may be provided, and a plurality of resist coating chambers 410 may be provided in each of the first direction 12 and the third direction 16. A plurality of bake chamber 420 may be provided in each of the first direction 12 and the third direction 16.

The carrying chamber 430 is situated in parallel to the buffer module 300 in the first direction 12. A coating robot 432 and a guide rail 433 may be situated in the carrying chamber 430. The carrying chamber 430 has a substantially rectangular shape. The coating robot 432 carries the wafer W between any two of the bake chambers 420, the resist coating chambers 410, and the buffer unit 500 of the buffer module 300. The guide rail 433 is disposed such that the lengthwise direction thereof is parallel to the first direction 12. The guide rail 433 guides the coating robot 432 such that the coating robot 432 is linearly moved in the first direction 12. The coating robot 432 has a hand 434, an arm 435, a support 436, and a prop 437. The hand 434 is fixedly installed in the arm 435. The arm 435 has a flexible structure such that the hand 434 is movable horizontally. The support 436 is provided such that the lengthwise direction thereof is disposed along the third direction 16. The arm 435 is coupled to the support 436 to be linearly movable in the third direction 16 along the support 436. The support 436 is fixedly coupled to the prop 437, and the prop 437 is coupled to the guide rail 433 to be movable along the guide rail 433.

The resist coating chambers 410 have the same structure. However, the types of photoresists used in the resist coating chambers 410 may be different. As an example, the photoresist may be a chemical amplification resist. The resist coating chamber 410 coats a photoresist onto the wafer W. The resist coating chamber 410 has a housing 411, a support plate 412, and a nozzle 413. The housing 411 has an open-topped cup shape. The support plate 412 is situated in the housing 411, and supports the wafer W. The support plate 412 may be provided to be rotatable. The nozzle 413 supplies a photoresist onto the wafer W positioned on the support plate 412. The nozzle 413 has a circular pipe shape, and may supply a photoresist to the center of the wafer W. Optionally, the nozzle 413 may have a length corresponding to the diameter of the wafer W, and the discharge hole of the nozzle 413 may be a slit. Further, additionally, a nozzle 414 for supplying a cleaning liquid such as deionized water to clean a surface of the wafer W, to which the photoresist is coated, may be further provided in the resist coating chamber 410.

The bake chamber 420 heat-treats the wafer W. For example, the bake chambers 420 perform a prebake process of eliminating organic substances and moisture on the surface of the wafer W by heating the wafer W at a predetermined temperature before a photoresist is coated or a soft bake process performed after a photoresist is coated onto the wafer W, and performs a cooling process of cooling the wafer W after the heating processes.

Each of the bake chambers 420 has a heating unit 800 or a cooling unit 422. Some of the bake chambers 420 may include only a heating unit 800, and some of the bake chambers 420 may include only a cooling unit 422. Selectively, the heating unit 800 and the cooling unit 422 may be provided in one bake chamber 420.

Figure 12:
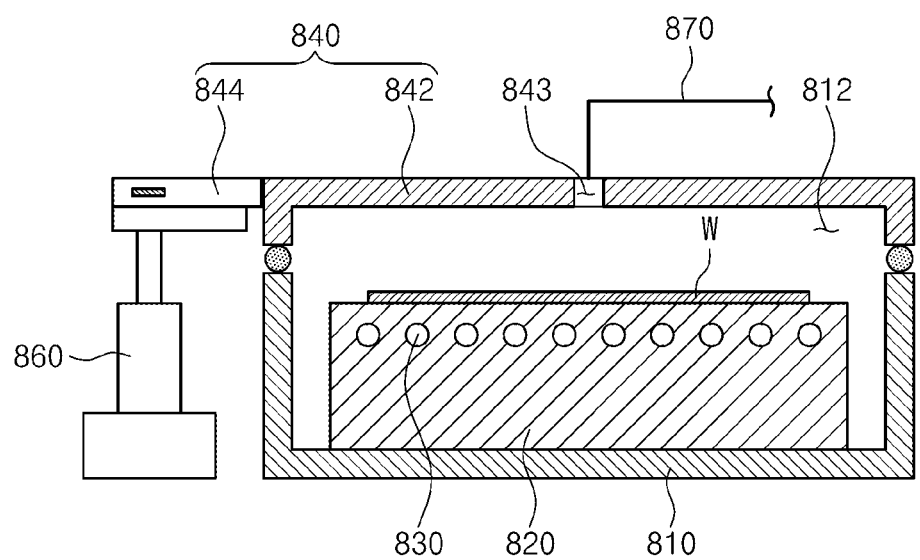
FIG. 12 is a sectional view illustrating a heating unit of FIG. 2.

The heating unit 800 heats the wafer W. FIG. 12 is a sectional view illustrating a heating unit 800 of FIG. 2. Referring to FIG. 12, the heating unit 800 includes a housing 810, a substrate support unit 820, a temperature adjusting member 830, a cover 840, a driving member 860, and an exhaustion unit 870.

The housing 810 is located in the bake chamber 420. The housing 810 has a treatment space 812, in which the wafer W is heated, in the interior thereof. The housing 810 has an open-topped vessel shape.

Figure 13:
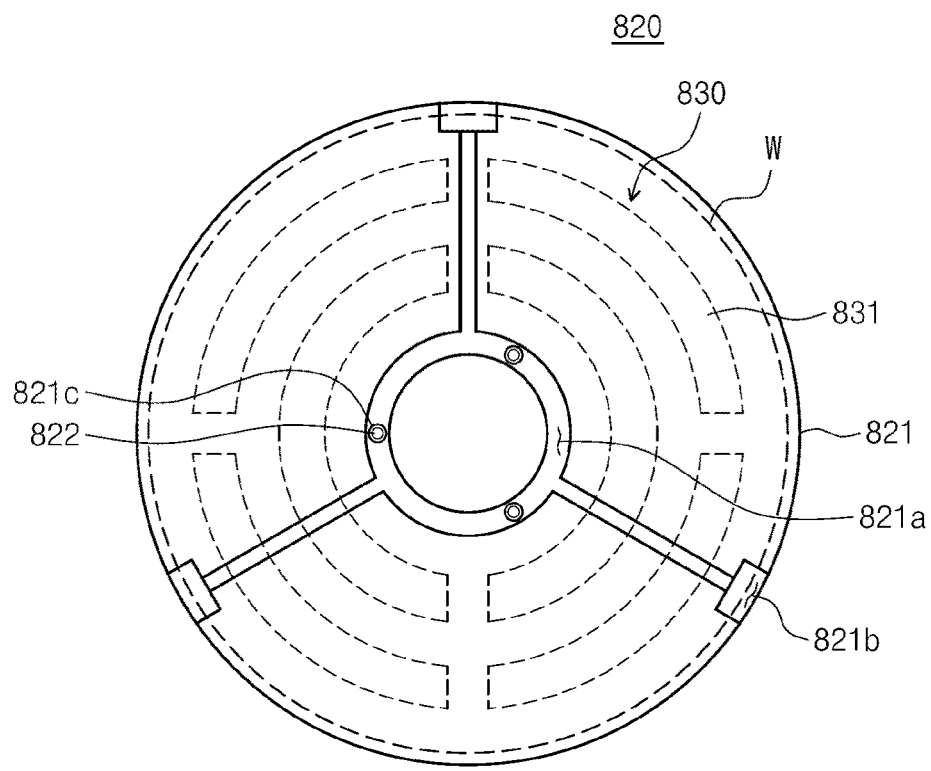
FIG. 13 is a view a substrate support unit of FIG. 12, when viewed from the top.
Figure 14:
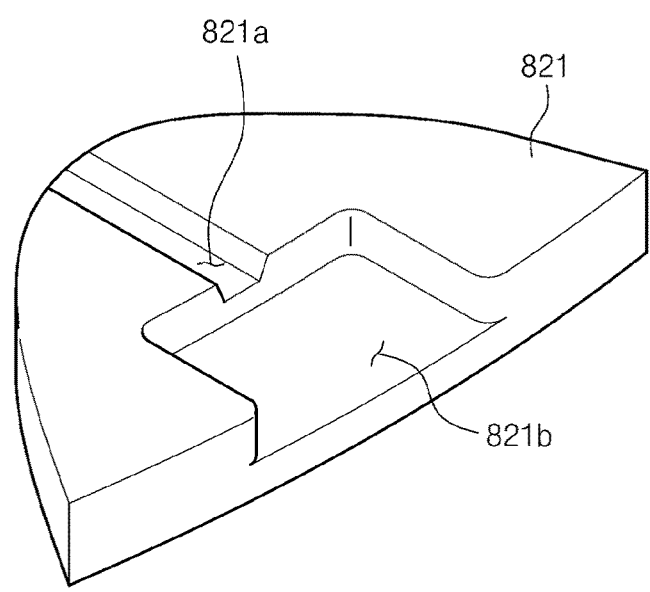
FIG. 14 is a perspective view illustrating a recess of FIG. 13.

FIG. 13 is a view a substrate support unit of FIG. 12, when viewed from the top. FIG. 14 is a perspective view illustrating a recess 821b of FIG. 13. Referring to FIGS. 12 to 14, the substrate support unit 820 supports the substrate in the treatment space 812. The substrate support member 820 includes a support plate 821 and a lift pin 822.

The support plate 821 is provided to have a circular plate shape. An upper surface of the support plate 821 is provided as a support area, on which the wafer W is positioned. A passage 821a is formed on an upper surface of the support plate 821. A recess 821b that is recessed inwards from a side surface of the support plate 821 is formed in a peripheral area of the support plate 821. A plurality of pin holes 821c are formed in the support plate 821. A lift pin 822 for positioning the wafer W on the upper surface of the support plate 821 and lifting the wafer W from the upper surface of the support plate 821 is provided in each of the pin holes 821c. The lift pin 822 is provided to be moved vertically.

The configurations, shapes, and structures of the passage 821a, the recess 821b, and the pin hole 821c are substantially the same as those of the passage 521a, the recess 521b, and the pin hole 521c of FIGS. 8 to 11. Meanwhile, unlike the recess 521b of FIG. 11, the recess 821b may be recessed downwards from the upper surface of the support plate 821, selectively according to the shape of the support plate 821.

The temperature adjusting member 830 adjusts the temperature of the substrate supported by the support plate 821. According to an embodiment, the temperature adjusting member 830 may include a heating member that heats the wafer W supported by the support plate 821. For example, the temperature adjusting member 830 includes a plurality of heaters 831. The heaters 831 are located in the interior of the support plate 821. The heaters 831 are located on the same plane. The heaters 831 heat different areas of the support plate 820. The areas of the support plate 821 corresponding to the heaters 831 are provided as heating zones. For example, the heaters 831 may be thermoelectric elements or heating wires.

Referring to FIG. 12 again, the cover 840 opens and closes the treatment space 812 of the housing 810. The cover 840 includes a body 842 and a support 844. The body 842 may be attached to or detached from the housing 810. The body 842 may be mounted on the housing 810 to interrupt the treatment space 812 from the outside. The body 842 has a circular plate shape.

The body 842 has an exhaustion hole 843. The exhaustion hole 843 corresponds to the central axis of the body 842. An exhaustion pipe 871, which will be described below, is connected to the exhaustion hole 843. The atmosphere of the treatment space 812 and the particles generated in the treatment space 812 are exhausted to the outside through the exhaustion hole 843 and the exhaustion pipe 871.

The support 844 supports the body 842 such that the body 842 may be mounted on the driving member 860. The support 844 supports a peripheral area of one side of the body 842. The support 844 extends from a peripheral area of one side of the body 842.

The driving member 860 elevates the cover 840. The driving member 860 moves the cover 840 to an interruption location and an opening location. Here, the interruption location is a location at which the cover 840 is mounted on the housing 810 such that the treatment space 812 of the housing 810 may be interrupted from the outside. Here, the opening location is a location at which the cover 840 is detached from the housing 810 such that the treatment space 812 of the housing 810 may communicate with the outside. According to an example, the cover 840 located at the opening location may be located higher than the cover 840 located at the interruption location.

The cooling unit 422 cools the substrate. The configuration, structure, shape, and function of the substrate support unit that supports the substrate of the cooling unit 422 are substantially the same as those of the heating unit 800. Meanwhile, the temperature adjusting member includes a cooling member for cooling the substrate. For example, the cooling unit may be cooling water or a thermoelectric element.

Referring to FIGS. 2 to 4 again, the development module 402 includes a development process, a process of eliminating a photoresist by supplying a development liquid to obtain a pattern on the wafer W, and a heat treating process, such as heating and cooling, which are performed on the wafer W before and after the development process. The development module 402 has a development chamber 460, a bake chamber 470, and a carrying chamber 480. The development chamber 460, the bake chamber 470, and the carrying chamber 480 are sequentially disposed along the second direction 14. Accordingly, the development chamber 460 and the bake chamber 470 are spaced apart from each other in the second direction 14 while the carrying chamber 480 is interposed therebetween. A plurality of development chambers 460 may be provided, and a plurality of development chambers 460 may be provided in each of the first direction 12 and the third direction 16. A plurality of bake chamber 470 may be provided in each of the first direction 12 and the third direction 16.

The carrying chamber 480 is situated in parallel to the buffer unit 500 of the buffer module 300 in the first direction 12. A development robot 482 and a guide rail 483 may be situated in the carrying chamber 480. The carrying chamber 480 has a substantially rectangular shape. The development robot 482 carries the wafer W between any two of the bake chambers 470, the development chambers 460, the buffer unit 500 of the buffer module 300, the cooling chamber 350. The guide rail 483 is disposed such that the lengthwise direction thereof is parallel to the first direction 12. The guide rail 483 guides the development robot 482 such that the development robot 432 is linearly moved in the first direction 12. The development robot 482 has a hand 484, an arm 485, a support 486, and a prop 487. The hand 484 is fixedly installed in the arm 485. The arm 485 has a flexible structure such that the hand 484 is movable horizontally. The support 486 is provided such that the lengthwise direction thereof is disposed along the third direction 16. The arm 485 is coupled to the support 486 to be linearly movable in the third direction 16 along the support 486. The support 486 is fixedly coupled to the prop 487. The prop 487 is coupled to the guide rail 483 to be linearly movable along the guide rail 483.

The development chambers 460 have the same structure. However, the types of development liquids used in the development chambers 460 may be different. The development chambers 460 eliminate an area of the photoresist on the wafer W, to which light is irradiated. Then, an area of the protective film, to which light is irradiated, is eliminated together. Optionally, only an area of the photoresist and the protective film, to which light is not irradiated, may be eliminated according to the type of the used photoresist.

The development chamber 460 has a housing 461, a support plate 462, and a nozzle 463. The housing 461 has an open-topped cup shape. The support plate 462 is situated in the housing 461, and supports the wafer W. The support plate 462 may be provided to be rotatable. The nozzle 463 supplies a development liquid onto the wafer W positioned on the support plate 462. The nozzle 463 may have a circular pipe shape, and may supply a development liquid to the center of the wafer W. Optionally, the nozzle 463 may have a length corresponding to the diameter of the wafer W, and the discharge hole of the nozzle 463 may be a slit. The development chamber 460 may be further provided with a nozzle 464 that supplies a cleaning liquid such as deionized water to clean the surface of the wafer W, to which the development liquid is additionally supplied.

The bake chamber 470 of the development module 402 heats the wafer W. For example, the bake chambers 470 may perform a post bake process of heating the wafer W before the development process, a hard bake process of heating the wafer W after the development process, and a cooling process of cooling the heated wafer after the bake process. The bake chamber 470 has a cooling unit 471 and a heating unit 472. The cooling unit 471 and the heating unit 472 may have configurations, shapes, and functions that are similar to those of the cooling unit 422 and the heating unit 800. Some of the bake chambers 470 may include only a cooling unit 471, and some of the bake chambers 472 may include only a heating unit 472. Selectively, the cooling unit 471 and the heating unit 472 may be provided in one bake chamber 470.

Because the configurations of the bake chamber 470 of the development module 402 are similar to those of the bake chamber of the coating module 402, a detailed description thereof will be omitted.

As described above, the coating/development module 400 is provided such that the coating module 401 and the development module 402 are separated. When viewed from the top, the coating module 401 and the development module 401 may have the same chamber disposition.

The interface module 700 feeds the wafer W. The interface module 700 includes a frame 710, a first buffer 720, a second buffer 730, and an interface robot 740. The first buffer 720, the second buffer 730, and the interface robot 740 are situated within the frame 710. The first buffer 720 and the second buffer 730 are spaced apart from each other by a predetermined distance, and may be stacked. The first buffer 720 is disposed at a location higher than the second buffer 730.

The interface robot 740 is located to be spaced apart from the buffer unit 500 in the second direction 14. The interface robot 740 transports the substrate W between the buffer unit 500 and the exposure module 900.

The first buffer 720 temporarily preserves the substrates W, on which the process has been performed, before the substrates W are moved to the exposure module 900. The first buffer 720 of the interface module 900 is substantially the same as the buffer unit 500 of the buffer module 300.

Until now, it has been described that the substrate treating apparatus according to an embodiment of the inventive concept is an apparatus for performing a baking process on a substrate and a buffer module in which a substrate is temporarily stays as examples. However, the inventive concept is not limited to the above-described examples, and may be applied to all apparatuses that support a substrate in a treatment space, in which a substrate is treated.

As described above, by providing the passage and the recess in the substrate support unit that supports a substrate, the gases between the substrate and the support plate may smoothly flow so that vibration may be minimized and the substrate may be stably positioned when the apparatus according to the inventive concept lifts the substrate.

According to an embodiment of the inventive concept, the apparatus according to the inventive concept may minimize vibration when a plate is lifted.

Further, according to an embodiment of the inventive concept, the apparatus according to the inventive concept may stably position the substrate.

The above description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A substrate support unit configured to support a substrate, the substrate support unit comprising:
a support plate, on which the substrate is positioned,
wherein the support plate includes:
a passage formed on a first surface of the support plate and connecting a central area and a side surface of the support plate; and
a recess formed in a peripheral area of the support plate and recessed inwards from the side surface of the support plate, and
wherein
the recess communicates with one end of the passage,
the passage is recessed from the first surface of the support plate towards a second surface opposite the first surface,
when viewed from the first surface, the width of the recess is larger than the width of the passage.

2. The substrate support unit of claim 1,
wherein the vertical length of the recess is larger than the depth of the passage.

3. The substrate support unit of claim 2, wherein when viewed from the first surface, an inner end of the recess overlaps a peripheral area of the substrate positioned on the support plate.

4. The substrate support unit of claim 3, wherein the substrate support unit further includes:
a plurality of lift pins that seats the substrate to the support plate and lifts the substrate from the support plate,
wherein the support plate has pin holes, through which the lift pins are elevated, and
wherein the passage connects the pin holes and the side surface of the support plate.

5. The substrate support unit of claim 4, wherein the passage includes:
a first passage provided in a central area of the support plate in a ring shape; and
a second passage connecting the first passage and the recess, and
wherein when viewed from the first surface, the first passage overlaps the pin holes.

6. A substrate support unit configured to support a substrate, the substrate support unit comprising:
a support plate, on which the substrate is positioned,
wherein the support plate includes:
a passage formed on a first surface of the support plate and connecting a central area and a side surface of the support plate; and
a recess formed in a peripheral area of the support plate and recessed inwards from the side surface of the support plate, and
wherein the recess communicates with one end of the passage,
a side surface of the passage is inclined inwards as the passage extends from the first surface of the support plate to a second surface opposite the first surface.

7. The substrate support unit of claim 6, wherein the passage has a trapezoidal shape comprising a first edge between the first and second surfaces and a second edge disposed on the first surface, the first edge of which is narrower than the second edge of the trapezoidal shape when viewed in a direction perpendicular to the length direction of the passage.

8. The substrate support unit of claim 6, wherein the passage has a V shape when viewed in a direction perpendicular to the length direction of the passage.

9. A heating unit configured to heat a substrate, the heating unit comprising:

a housing configured to provide a space in the interior thereof;

a substrate support unit configured to support the substrate in the space and having a support plate, on which the substrate is positioned; and a temperature adjusting member configured to adjust the temperature of the substrate supported by the support plate, wherein the support plate includes:
- a passage formed on a first surface of the support plate and connecting a central area and a side surface of the support plate; and
- a recess formed in a peripheral area of the support plate and recessed inwards from the side surface of the support plate, and wherein
the recess communicates with one end of the passage,
the passage is recessed from the first surface of the support plate towards a second surface opposite the first surface,
when viewed from the first surface, the width of the recess is larger than the width of the passage.

10. The heating unit of claim 9, wherein the vertical length of the recess is larger than the depth of the passage.

11. The heating unit of claim 10, wherein when viewed from the first surface, an inner end of the recess overlaps a peripheral area of the substrate positioned on the support plate.

12. The heating unit of claim 11, wherein the substrate support unit further includes:
a plurality of lift pins that seats the substrate to the support plate and lifts the substrate from the support plate,
wherein the support plate has pin holes, through which the lift pins are elevated, and
wherein the passage connects the pin holes and the side surface of the support plate.

13. The heating unit of claim 12, wherein the passage includes:
a first passage provided in a central area of the support plate in a ring shape; and
a second passage connecting the first passage and the recess, and
wherein when viewed from the first surface, the first passage overlaps the pin holes.

14. The heating unit of claim 10, wherein a side surface of the passage is inclined inwards as the side surface of the passage extends from the first surface toward the second surface.

15. The heating unit of claim 14, wherein the passage has a trapezoidal shape comprising a first edge between the first and second surfaces and a second edge disposed on the first surface, the first edge of which is narrower than the second edge of the trapezoidal shape when viewed in a direction perpendicular to the length direction of the passage.

16. The heating unit of claim 14, wherein the passage has a V shape when viewed in a direction perpendicular to the length direction of the passage.

17. The heating unit of claim 10, wherein the temperature adjusting unit includes:
a cooling member provided in the support plate and configured to cool the substrate supported by the support plate.

18. The heating unit of claim 17, further comprising:
a buffer plate located on the support plate.

19. The heating unit of claim 10, wherein the temperature adjusting unit further includes:
a heating member provided in the support plate and configured to heat the substrate supported by the support plate.

* * * * *